(12) United States Patent
Amann et al.

(10) Patent No.: US 6,451,389 B1
(45) Date of Patent: Sep. 17, 2002

(54) METHOD FOR DEPOSITION OF DIAMOND LIKE CARBON

(75) Inventors: Michael S. Amann, Loveland; Michael Kishinevsky, Fort Collins; Andrew Shabalin, Fort Collins; Colin Quinn, Fort Collins, all of CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 09/551,169

(22) Filed: Apr. 17, 2000

Related U.S. Application Data
(60) Provisional application No. 60/129,850, filed on Apr. 17, 1999.

(51) Int. Cl.$^7$ .................................................. H05H 1/24
(52) U.S. Cl. ................ 427/577; 427/249.7; 427/255.23; 427/255.28; 427/585
(58) Field of Search ................................ 427/294, 523, 427/249.7, 255.23, 255.28, 569, 585, 577

(56) References Cited

U.S. PATENT DOCUMENTS

| | | | |
|---|---|---|---|
| 4,975,144 A | 12/1990 | Yamazaki et al. | 156/643 |
| 5,294,262 A | 3/1994 | Nishimura | 134/22.1 |
| 5,378,285 A | 1/1995 | Mitani et al. | 118/723 |
| 5,427,669 A | 6/1995 | Drummond | 204/298.08 |
| 5,535,906 A | 7/1996 | Drummond | 216/67 |
| 5,616,179 A | 4/1997 | Baldwin et al. | 117/108 |
| 5,645,698 A | 7/1997 | Okano | 204/192.12 |
| 5,718,813 A | 2/1998 | Drummond et al. | 204/192.12 |
| 5,747,935 A | 5/1998 | Porter et al. | 315/111.51 |
| 5,763,989 A | 6/1998 | Kaufman | 313/361.1 |
| 6,007,879 A | 12/1999 | Scholl | 427/562 |

FOREIGN PATENT DOCUMENTS

| | | | | |
|---|---|---|---|---|
| FR | 0781921 | A1 | 7/1997 | F03H/1/00 |
| JP | 07331440 | | 12/1995 | C23C/16/26 |
| WO | PCT/US00/10304 | | 4/2000 | |

OTHER PUBLICATIONS

"Diamondlike Carbon and Sic–Films Obtained by the Industrial Ion Source with a Cold Cathode", Enisherleva, K.L., et al., Scientific Research Institute "Pulsar", Moscow, Russia, 1997, 14 pages. (No month avail.).

"Investigations of Diamond–Like Carbon Films Produced Directly From an Ion Beam of Industrial Ion Source with a Cold Cathode", Enisherleva, K.L., et al., Materials Science and Engineering B, 1997, pp 137–140. (No month avail.).

*Development of High Current Negative Ion Source*, T. Kuroda, National Institute for Fusion Science, Furo–cho, Nagoya, 464–01, Japan, Fusion Engineering and Design 36 (1997), 143–156. (No month avail.).

*Hydrogen Content and Bonding Structure of Diamond–Like Carbon Films Deposited by Ion beam Deposition*, Koki Tanaka, Morihiro Okada, Takumi Kohno, Minoru Yanokura, and Michi Aratani, Nuclear Instruments and Methods in Physics Research B58 (1991), 34–38. (No month avail.).

*Primary Examiner*—Bernard Pianalto
(74) *Attorney, Agent, or Firm*—Santangelo Law Offices, P.C.

(57) ABSTRACT

Systems to achieve both more uniform and particle free DLC deposition is disclosed which automatically cycles between modes to effect automatic removal of carbon-based buildups or which provides barriers to achieve proper gas flow involves differing circuitry and design parameter options. One ion source may be used in two different modes whether for DLC deposition or not through automatic control of gas flow types and rates and through the control of the power applied to achieve maximum throughput or other desired processing goals. Arcing can be controlled and even permitted to optimize the overall results achieved.

44 Claims, 7 Drawing Sheets

METHOD FOR DEPOSITION OF DIAMOND LIKE CARBON

This patent application claims priority from and the benefit of U.S. Patent Application Ser. No. 60/129,850 entitled "Apparatus and Method for Uniform Deposition of a Diamond Like Carbon on a Substance" filed Apr. 17, 1999, hereby incorporated by reference.

BACKGROUND OF THE INVENTION

This invention generally relates to deposition of thin films using ion beams and the like. Specifically, the invention has application to deposition of diamond-like carbon (DLC) films where requirements for the deposited films include low particle contamination and high uniformity.

Ion beam deposition of diamond-like films is known and has been studied by different authors. Enisherova et al in Material Science and Engineering B46 (1997), pp. 137–140, incorporated by reference here into, investigated properties of DLC deposited on a substrate using an industrial cold cathode ion source. Baldwin et al in US patent 5,616,179, incorporated by reference here into, disclosed a DLC deposition method using an end-Hall ion source. Further, even though not particularly relevant to the present invention, to the extent it may be helpful background understanding of some other types of processing can be obtained from other publications, such as U.S. Pat. Nos. 5,427,669, 5,535,906, 5,645,698, 5,718,813, and 5,747,935, each to the assignee of the present invention.

Computer hard disk protective coatings and some other applications are sensitive to particle contamination of the surface. Those skilled in the art know that particle contamination problems can accompany virtually all carbon-containing plasma applications. Carbon material in such plasmas can tend to conglomerate into particles that are precipitated or formed on most, if not all, surfaces in the vacuum chamber, including the substrate surface. The particles often grow in size with time and, as mentioned, can find their way to the substrate surface. In addition, accumulated carbon material inside the ion source can change discharge parameters and eventually may short circuit ion source electrodes. While this may be tolerable in some applications, in sensitive applications—such as the computer disk processing mentioned above—particulate or carbon contamination is not acceptable.

This can create a necessity to open the vacuum chamber on regular basis and to remove carbon deposits from the ion source and vacuum chamber wall. This maintenance can increase the downtime and may result in lost productivity. It may also create variability in processing. In such applications, the present invention can act to virtually eliminate particle contamination without the need to open the vacuum chamber for cleaning. In addition to producing particle-free films, an additional benefit of the invention can be the possibility of virtually maintenance-free operation of the ion source itself.

One additional desire well known to those skilled in the art is the uniformity of coating over the substrate surface. This aspect is especially difficult in systems that process one substrate at a time because it can be difficult to achieve particle free coating and even uniform distribution of ion beams current density and gas pressure over the substrate surface. As to the latter aspect, a conventional way to achieve high uniformity can be to move the substrate in front of the deposition source. This movement is often present in in-line and carousel type coating systems but in single substrate systems the movement of substrate can complicate the process significantly and increase the cost of equipment. Many times a complicated two-axis planetary pattern of substrate movement needs to be used, as in the paper of Enisherova, mentioned above.

Further, there is currently a desire in the disk industry to find a replacement for currently used magnetron-based amorphous carbon deposition systems. Such a replacement would preferably deposit diamond-like-carbon and fit into existing equipment. It would also not allow or require substrate movement during the deposition process. The present invention achieves high uniformity and particle free coating with stationary substrate by optimization of the ion source design and utilization.

Perhaps surprisingly, the present invention provides solutions to many problems in manners using technologies which others might have had available. However, the fact that there was a long felt but unsatisfied need for this type of invention while the needed implementing arts and elements had long been available and the fact that there was no full appreciation of the nature of the problem by those skilled in the art each seem to show how the invention is considerably more s significant than simply a choice in mode of operation or the like for these applications. The significant inconvenience suffered by operators and the potentially substantial attempts by those skilled in the art to overcome the problems show the difficulties extant. Thus it appears that at least some of these difficulties were because of a failure to understand the problems to the degree now explained.. Through adoption of other, less economical solutions and the large degree of improvement (rather than merely gradual steps), the invention may be shown to present approaches which others acted to teach away from. It may also indicate that the results of the invention would be considered unexpected if initially viewed without the hindsight of an exposure to this disclosure.

SUMMARY OF THE INVENTION

A method that is the subject of one embodiment of the present invention can make use of the fact that some cold cathode ion sources, such as the well-known multicell ion sources and linear ion sources series manufactured by Advanced Energy Industries, Inc., Fort Collins, Colo., are capable of running a discharge in an oxygen-containing gas mixture or in pure oxygen. The present inventors have found that a discharge can clean the ion source and vacuum chamber surfaces from carbon and that periodical application of a new mode of operation described herein, the reactive cleaning cycle, can allow the deposition process to run without adding any substantial particle contamination on the substrate. This may even exist virtually indefinitely. The discharge reactive cleaning cycle can also eliminate the need for opening the vacuum chamber in order to remove carbon or the like from the inside of the chamber and the ion source. Perhaps surprisingly, in some situations it may be that the reactive cleaning cycle time can be much shorter that the deposition time.

Additionally, those skilled in the art also know that it is difficult to achieve uniformity of the coating thickness over the entire substrate surface when substrates are coated one at a time by a wide ion beam, like in many hard disk coating machines. In the apparatus used by Enisherova et al, the substrate was moved in front of the ion source in a complicated planetary way during the deposition to make the film more uniform. For many applications, like hard disk protective coating, the substrate movement is not practical or is prohibitively expensive. Therefore, there is a need to achieve acceptable thickness uniformity with a stationary substrate. Accordingly, in other embodiments, the present invention discloses ways to optimize the apparatus design to achieve maximum uniformity at given maximum ion source size.

Accordingly, it is an object of the invention to avoid or minimize the effects of carbon or particle contamination in sensitive coating processes. In keeping with this object it is a goal to provide a system which acts automatically and thus without a need to have an operator physically access the interior of the chamber to address an undesirable condition.

In is also an object to provide coatings of higher quality and of more uniformity than was previously done.

Yet another object is to provide a new mode of operation of an ion source so that different types of processing may be accomplished in a variety of contexts.

Naturally, other objects of the invention are disclosed throughout other areas of the specification and claims. In addition, the goals and objectives may apply either in dependent or independent fashion to a variety of other goals and objectives in a variety of embodiments.

DETAILED DESCRIPTION OF THE PREFERRED EMBODIMENTS

As can be easily understood, the basic concepts of the present invention may be embodied in a variety of ways. It involves both processing techniques as well as devices to accomplish the appropriate processing. In this application, each is disclosed as part of the results shown to be achieved by the various devices and methods described and as steps which are inherent to utilization. In addition, while some devices are disclosed, it should be understood that these not only accomplish certain methods but also can be varied in a number of ways. Importantly, as to all of the foregoing, all of these facets should be understood to be encompassed by this disclosure.

Figure 8:
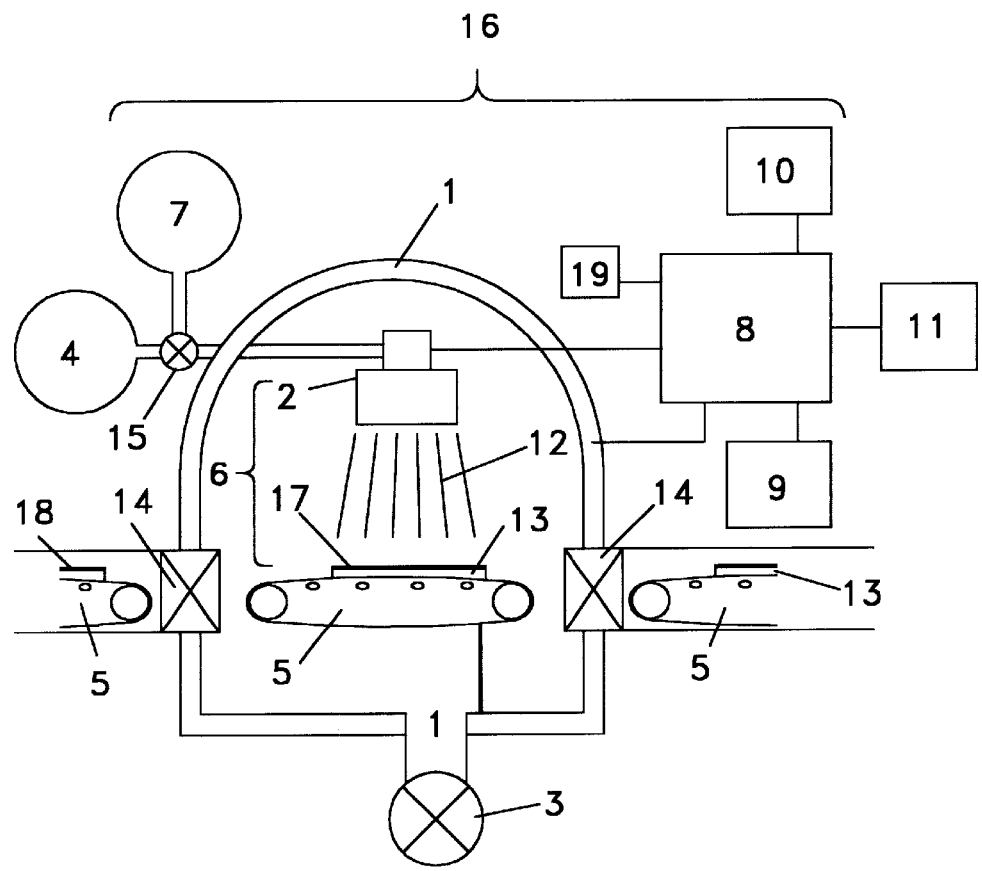
FIG. 8 is a schematic diagram of an apparatus designed to achieve particle-free coating according to the present invention.

One type of system is shown schematically in FIG. 8. As can be seen, the involves some type of chamber (1) within which an appropriate low pressure environment can be created. As is well known, this is usually accomplished through some type of vacuum system (3) connected in some way to the chamber (1). As may be easily understood from the prior art, with the chamber may be positioned some type of substrate (13) for processing. Without limiting the applications, one type of substrate (13) which is of particular importance is a computer disk such as for a hard drive or the like. As is well understood, hard disks may be of any size, and may be made out of aluminum, or glass, or any other solid material. This material can thus be the substrate (13) which is to be coated.

The coating (17), such as a diamond-like-carbon coating, can be produced by some action of an ion source (2). (Two sources could, of course be included if it were desired to coat both sides of 10 the substrate (13).) This ion source may act as an ion beam source in which case an ion flux (12) is produced (as explained later this term is intended to cover any dispersion of ions regardless of the focusing or the "beam" character). The ion flux (12) such as a beam is influenced in some manner by the introduction of a gaseous substance, such as a gaseous beam substance (4) usually at a specific location in the vicinity of the ion source (2). By the proper selection of parameters and substances, the ion source can thus serve as a material processing ion source, that is a source which achieves a specific type of processing. Two types of processing of importance to this preferred embodiment are processing which achieves a diamond-like-carbon coating on a substrate and processing which removes accumulated carbon from chamber surfaces.

As is well known, the ion source (2) achieves its goals by not only the application of a gaseous beam substance (4) inside or in the vicinity of it by also the application of power to it. This power may be supplied by a power application element (8). Power application element (8) may supply power of such a character as to serve as a beam creation power application element or the like or it may, as discussed below, be of such a character as to serve as a reactive discharge application element or the like. In achieving a deposition appropriate beam, the source might have a first power condition applied to it. This might typically produce a beam with enough ions of the type of element(s) being deposited and have low enough content of any reactive element that the ions can form volatile or gaseous species containing the deposited element so the net result of exposure of the substrate to the beam is some material left on the surface of the substrate.

Conversely, a reactive-appropriate beam or discharge might be powered by a second power condition which could, but need not always be typically different from the first power condition. The reaction-appropriate beam then may or may not be produced to contain reactive elements but it might normally not contain material that has been deposited, so that the net result would be the removal of a product and potentially cleaning if desired.

As mentioned, the ion source (2) may or may not produce a focused beam. If focused, the ions would travel in a collimated fashion. If not, a diffuse beam might exist as the ion flux (12). A diffuse beam or discharge would have a wide angular distribution. As applicable to multi-cell ion sources it should be understood that even in a high voltage or other more collimated mode, the resultant ion migration could be divergent. For example, if each cell produced a collimated beam but the resultant multicell ion source beam consisted of multiple annular beamlets created in the individual cells which were intentionally directed so that each diverged, the resulting beam at some distance might becomes smoother and similar to a truly diffuse beam. In general though, each cell would have produced a more collimated beam than imagined for a true diffuse discharge.

As is also known, the overall system, such as a diamond-like-carbon process system (16) could serve to repetitively process substrates in some manner. Movement of a substrate (13) could be achieved by the use of some type of substrate position element (5) which may act at any desired time in the overall process. It should be understood that while this is shown as a conveyer belt type of arrangement, such is for schematic purposes only and a great variety of designs may be used. The substrate position element (5) could serve as a repetitive substrate feed element so that the ion source (2) would repetitively achieve or form the desired processing as the repetitive substrate feed element acted in harmony. For application using the diamond-like-carbon processing mentioned and the carbon removal processing mentioned, the substrate position element (5) might also be arranged to serve by moving the substrate (13) through, into, or near some type of substrate isolation element such as the ports (14) as those skilled in the art readily understand. The substrate position element (5) might also serve as a substrate removal element similar to the design conceptually depicted in FIG. 8.

Of course, the ultimate goal is that of achieving some type of processing, such as by permitting the ion source (2) and the other elements to together serve as a diamond-like-carbon coating element. This may be achieved by utilizing a hydrocarbon containing gas as the gaseous beam substance (4). The hydrocarbon containing gas would create a hydrocarbon containing gas environment typically within the ion source (2) so that as a result of the ion source's action, a deposition appropriate ion beam could be produced. In this manner the arrangement would serve as a deposition-appropriate ion beam source and the power application element (8) could serve as a hydrocarbon beam creation power application element. As a result of some interaction of these the result may be a diamond-like-carbon coating (17) on the substrate (13) to result in a diamond-like-carbon coated substrate (18). As those skilled in the art understand, the hydrocarbon containing gas may be pure or it may be a mixture of a hydrocarbon gas and some other gas (noble or not) as the application requires.

Figure 6:
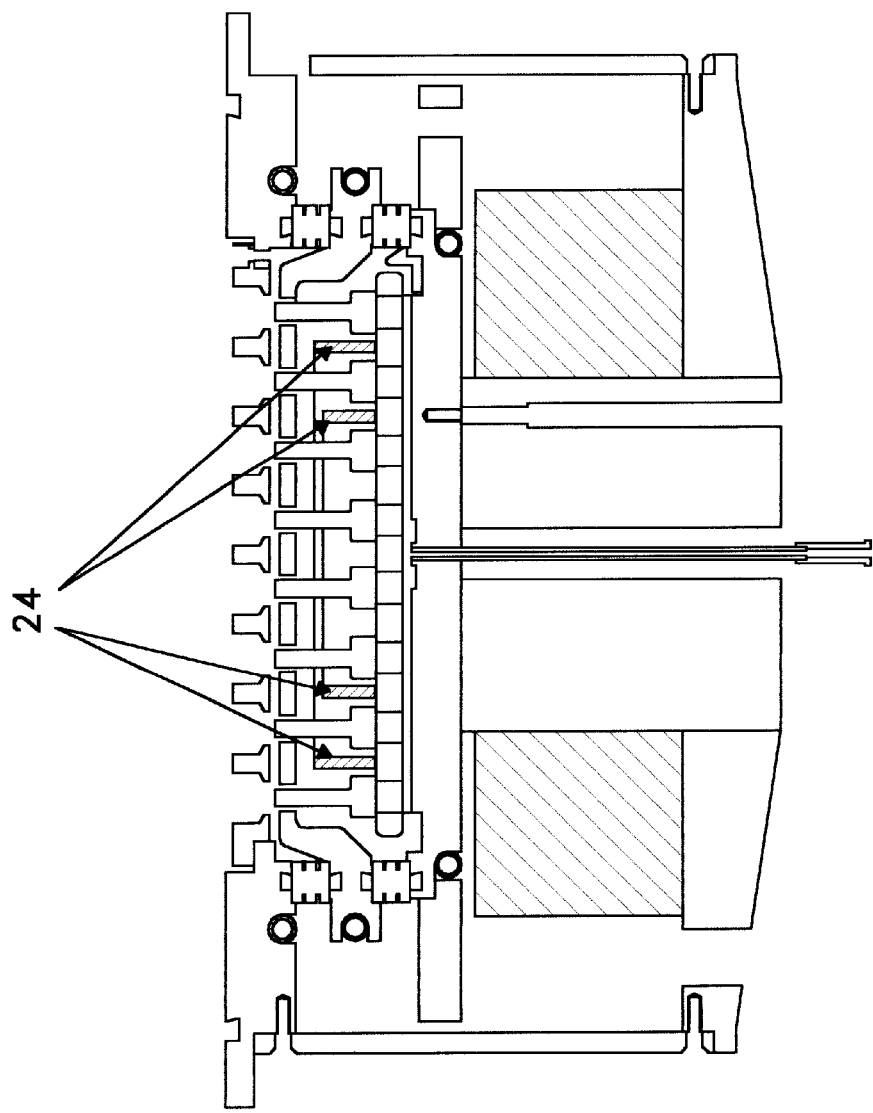
FIG. 6 is a cross sectional view of an MCIS Multicell ion source with radial gas flow barriers installed.

As mentioned, a great variety of different types of elements can be used. This can include different types of ion sources (2). Single- and multi-cell sources are of course possible. In the claims a variety of the many possible types of sources appropriate for this invention are listed. As can be seen in FIGS. 2 through 6, some of these include an AE LIS linear ion source (FIG. 2), a general linear ion source (FIG. 3), an AE MCIS-12 Multicell ion source (FIG. 4), a different view of the MCIS (FIG. 5), and a multicell ion source with radial gas flow barriers installed (FIG. 6). Cold cathode ion sources, non-hot electron emitter ion sources, closed drift ion sources, multi-cell cold cathode anode-layer closed drift ion sources, linear cold cathode anode-layer closed drift ion sources, anode-layer ion sources, end-hall ion sources, single cell sources, especially the AE Single Cell ion source (AE SCIS), are among the many others possibly utilized.

Figure 9:
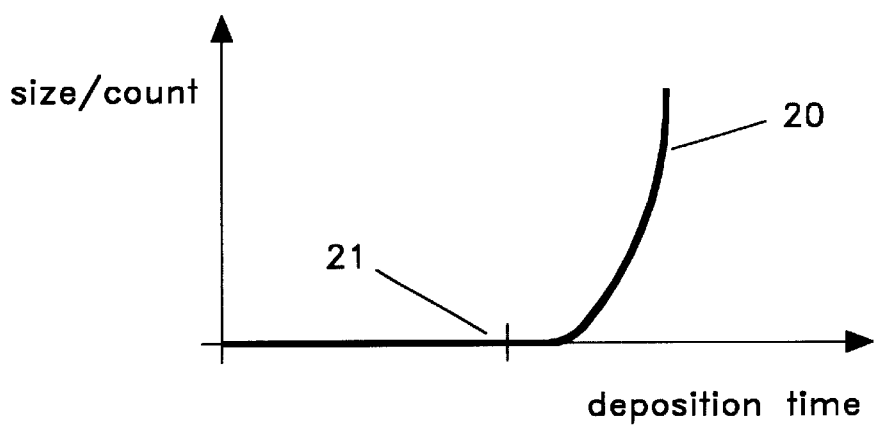
FIG. 9 is one example of a conceptual plot of carbon formation in a chamber.

As mentioned in the background section above, one of the problems which has existed is the formation of carbon particles. While in some applications, this may not be of particular concern, in hard disk processing, as but one example, the formation of carbon particles on the substrate can be completely unacceptable. This unfortunate byproduct of DLC coating processes is perhaps most appropriately characterized as the formation of any carbon based material—other than the desired material such as a diamond-like-carbon material. In observing the formation of carbon based material, it has been noticed that in at least some applications, the larger particles or higher number of particles form at an increasing rate. Although not quantified experimentally, this potentially could display a characteristic as shown conceptually in FIG. 9, where it can be seen that at some point in time, such as the point shown as item (21), the size, number, or both of particles as shown by the curve (20) begins to vary at a varying rate which begins to substantially increase.

As a significant aspect of this invention, it has been noted that by acting before the varying rate begins to substantially increase, the amount of time necessary to remove the particles—or perhaps more accurately acting even before they truly begin to form from a results perspective—the effects of carbon formation or particle formation can be largely overcome. This can be set at a variety of levels, but for the present systems, levels such as listed in the claims or perhaps less than the amount of time necessary to process about twenty computer disk substrates has been shown to be very advantageous. Naturally, this can vary based upon the situation, system, or processing being effected. Thus as shown, defining the point in time for the action, item (21), as relative to the initial average particle size or with reference to the initial, clean chamber particle time or processing achieved is possible.

Mentioned earlier with respect to the goals and objects of the invention is the fact that the present invention can achieve particle free coatings without a need for the traditional human intervention or cleaning. The system can thus achieve uninterrupted processing with total cumulative deposition depths which are far greater—and perhaps infinite—as compared to the prior systems which needed periodic cleaning. This can be accomplished by automatically cycling between the reactive and deposition modes. This cycling can be accomplished by a variety of power and gas controls as follows. First, the type of gas to be applied can be varied. Noteworthy is the fact that he last processed substrate such as the last diamond-like-carbon coated substrate (18) would usually need to be somehow isolated from the chamber area involved (the reactive environment would typically ruin the substrate), appropriate action could be taken. As to the gaseous beam substance (4), such as a hydrocarbon containing gas, the action could be to shutoff the gas.

Processing would then of course be stopped, if not stopped earlier. This could typically occur through an action of some type of automatic gas supply operation element (15). Any remaining hydrocarbon gas would then be purged by natural action of the vacuum system (3) which would thus serve as a gas purge element. Similarly, and in any sequence, the power application element (8) might be controlled to be shut off (perhaps even before the action of the automatic gas supply operation element (15)) through control circuitry or programming such as the timer element (11) or otherwise as those skilled in the art would readily appreciate. This might also act to stop the deposition cycle and stop the first power condition for the ion source.

Once the substrates were isolated (by coating, shielding, movement or otherwise), and after the deposition process had stopped, the automatic gas supply operation element (15) could then be activated (or be continued to be activated) to introduce a reactive gas (7) such as a carbon-reacting gas into the chamber. The carbon reacting gas would create a different environment in or near the ion source (2). Through circuitry or programming, the second power condition might automatically begin and be applied at some time. In this fashion the power application element (8) could be controlled to serve as a reactive discharge creation power application element and the same deposition-appropriate ion beam source might now begin to operate as a reactive discharge ion source. The ion source (2) would thus generate a discharge which was more appropriate for the removal of the carbon buildups that might be present. This carbon-reactive discharge could act within the chamber (1) to effect the processing of at least some carbon-containing surface by causing a reaction with some of the carbon-based material thereon. This reaction would preferably create a carbon-containing material of a gaseous nature and which could then be removed by the action of the gas purge element, usually the vacuum system (3).

As can be immediately appreciated, the above processing could be repeated sequentially at various times as appropriate to the system and processing achieved. Some of the times and various levels possible are set forth in the claims. Overall this configuration could serve as an element which affirmatively avoided carbon particle formation, or an affirmative avoidance element. Further, by removing the gaseous reaction product as mentioned, virtually virgin processing could be reinstituted. The entire sequence could be automatically controlled by programming, circuitry or the correct selection of elements to result in the automatic alteration events or elements, the automatic stopping events or elements, the automatic elimination events or elements, the automatic interruption events or elements, the automatic operation events or elements, and the automatic restart events or elements mentioned.

Independent of the application mentioned above, it should be understood that through the appropriate selection of the gas flows and power conditions applied, the ion source (2) can act in two entirely different modes. In the traditional mode, the ion current generated produces the typical deposition-appropriate beam. This may, but need not be the traditional, collimated beam. Here the beam may be one in which the beam current is roughly proportional to the voltage applied. In this traditional mode, the discharge voltage is set by power supply and the discharge current depends on the applied voltage and gas pressure. In other words, the power applied usually acts as a voltage source with low impedance and ion source functions as a high impedance current source. The higher the voltage and the higher the gas pressure—the higher the current. The ion source (2) acts as a high impedance current source and as a current-proportional-to-voltage source.

The operational mode utilized in the other condition is quite different. In fact, the ion source (2) essentially flips into that different mode, the low impedance discharge mode. In this mode, the material processing ion beam is actually a low impedance discharge mode material processing ion flux. Here, the discharge current is not so proportional to voltage. The power applied may only control discharge current, and the discharge voltage may be set by the ion source (2) itself. The voltage may not practically change when current varies widely. Thus, the power application element (8) may serve as a current source (high impedance) and the ion source (2) as a low impedance voltage source. Notably, it is now disclosed that either the deposition or reactive event can exist in this mode, especially for a single cell source where the low impedance discharge mode seems particularly possible for deposition as well as the mentioned carbon reaction.

The transition or dividing line between modes of operation may exist at a specific level, such as when the gas pressure in the source exceeds some threshold level. (Note, however, that in order to strike the discharge the applied may initially be high, but it may eventually become low after ignition.) In the low impedance discharge mode, the ion source can have a very high discharge current and the "beam" can become a low impedance discharge mode material processing ion flux. The ion source (2) acts as a low impedance current source and as a current-independent-of-voltage source. As those of ordinary skill in the art would appreciate, the gas pressure at which the transition occurs, which is appropriate, or which creates a low impedance discharge mode material processing ion flux gas environment can be a function of the gas feed rate and the vacuum chamber pumping speed. It may be considerably or just substantially higher than that in the deposition cycle. Whereas the gas flow for the high impedance mode (as traditionally for deposition) can be on the low side of the 1 to 1000 sccm range, the low impedance flow (as may be particularly appropriate for the reactive cycle, although both modes can work here, too, as well) can be on the high side of that same range—especially for a multi cell source. Naturally, the threshold gas pressure can also depend on source design and magnetic field strength.

By example, the two different modes can be understood through the various parameters of each cycle as follows. In each it should be understood that the values are representative of values as they might exist for only one type of system. As explained throughout this disclosure, such values can vary based upon a multitude of factors.

EXAMPLE 1

Multicell DLC Processing

| Deposition Cycle | | Reactive Cycle | |
|---|---|---|---|
| Source: | AE MCIS | Source: | AE MCIS |
| Deposition Gas: | 100% Butane | Reaction Gas: | 100% O$_2$ |
| Gas Flow: | 5 sccm | Gas Flow: | 16 sccm |
| Source Voltage: | 1500 volts | Source Voltage: | 1000 volts |
| Source Current: | 0.25 amperes | Source Current: | 0.5 amperes |

EXAMPLE 2

Single Cell DLC Processing

| Deposition Cycle | | Reactive Cycle | |
|---|---|---|---|
| Source: | AE SCIS | Source: | AE SCIS |
| Deposition Gas: | 100% Ethylene | Reaction Gas: | 100% O$_2$ |
| Gas Flow: | 17 sccm | Gas Flow: | 10 sccm |
| Source Voltage: | 450 volts | Source Voltage: | 440 volts |
| Source Current: | 1 ampere | Source Current: | 2.5 amperes |

As may be appreciated, an important difference is that in the low impedance discharge mode, the reactive cycles shown above, much higher discharge current and ion beam current can be delivered onto a substrate, even though the ion energy is lower than in the high impedance mode. Some processes benefit from high energy ions, and some cannot tolerate them at all and can work only with the low impedance discharge mode. In DLC system processing, the DLC properties can depend on the ion energy, so both high and low energy systems may be desirable.

As may be easily appreciated, the various times at which the different cycles are accomplished can be configured in a variety of ways. Certainly, the deposition and reaction cycles can be accomplished alternatingly and even periodically. These can be controlled by the timer element (11) determining a time to take an action, equivalently by setting a period for an action, or otherwise. Of course, the order may not be critical for many steps. The deposition cycle from (plus disk removal) can be repeated several times before the reaction and removal cycle occurs. The efficiency of the process can also be evaluated as number of deposition cycles for every reactive cycle, and this can establish how many good disks one makes before one is missed. Significantly, it has been discovered that with this disclosed process, the time for reacting can be short compared to the time during which deposition occurs. Again, some of the details are set forth in the claims.

Further, by configuring the frequency of the reactive cycle such that its period (whether determined by use of the action or action plus purge time) is equivalent to a single substrate processing time, more continuous feeding can occur. In this fashion, a substrate can be discarded, or, more likely a dummy substrate or no substrate at all may be "processed" in the reactive cycle.

Thus there could be desired substrates and discardable substrates, or even simply undesired ones or merely an avoidance of feeding desired ones. Significantly the level of the reactive cycle can be set to achieve maximum throughput or optimal throughput (factoring in the quality of the results achieved) or even the permit the maximum application of power. Once more, details are set forth in the claims. Again, the control circuitry would thus serve as a maximum power element and the timer element (11) could serve as an optimal throughput timer element.

The aspect of maximum power may involve arc control. As those skilled in the art understand, when processing it is traditional to avoid arcs so as not to ruin the processing being enacted. This can be facilitated by an arc avoidance element to control the power application element (8) as is well known. Interestingly, the deposition rate is often limited by arcing that can start when discharge current exceeds a certain limit. Even one arc during the deposition time may result in unacceptable particle contamination of the disk. As to this aspect, the present invention can even employ a ramped up power control as appropriate to specific situations to permit maximal processing without arcing since initial processing can be more prone to arc than later processing of a substrate. Again some of the possible details are mentioned in the claims. Further, applying the aspect of arc energy (as discussed in U.S. Pat. No. 6,007,879 to the assignee of the present invention, hereby incorporated by reference), can be important during the reactive cycle when arcing is permitted. It may be beneficial for some applications to hold the arc energy to values below such energies as 5, 1, 10, 20, 50, or even perhaps 100 millijoules, with arc energy held at below 20 millijoules potentially being of most benefit for removing carbon build ups in a practical manner.

In addition, it its different mode of operation, the present invention takes a different direction. It may actually include an arc permission element (19)! This is shown schematically as circuitry which actually controls the power application element (8) in a manner which purposefully permits some arcing. While it is possible that for some processing situations, the reactive cycle speed could also be limited by arcing, in many it is not. Even where it is, it can also be possible to run to much higher discharge currents and higher gas flow during reactive cleaning than during the deposition process. As mentioned, some arcing may be acceptable during the reactive cleaning cycle because there may be no substrate effectively present. However, it is also possible that too frequent arcs can reduce average discharge power due to dead time by arc handling circuitry of the power supply. It, therefore, can be desirable to make the reactive cycle time as short as possible compared to the accumulated deposition time, so the overall impact of the reactive cycle on the machine throughput would be minimal. Accordingly, the present invention can use a regulation loop in the power supply to keep the arc frequency below a certain point using a feedback from an arc frequency monitoring circuit to the power supply regulation loop.

Figure 7:
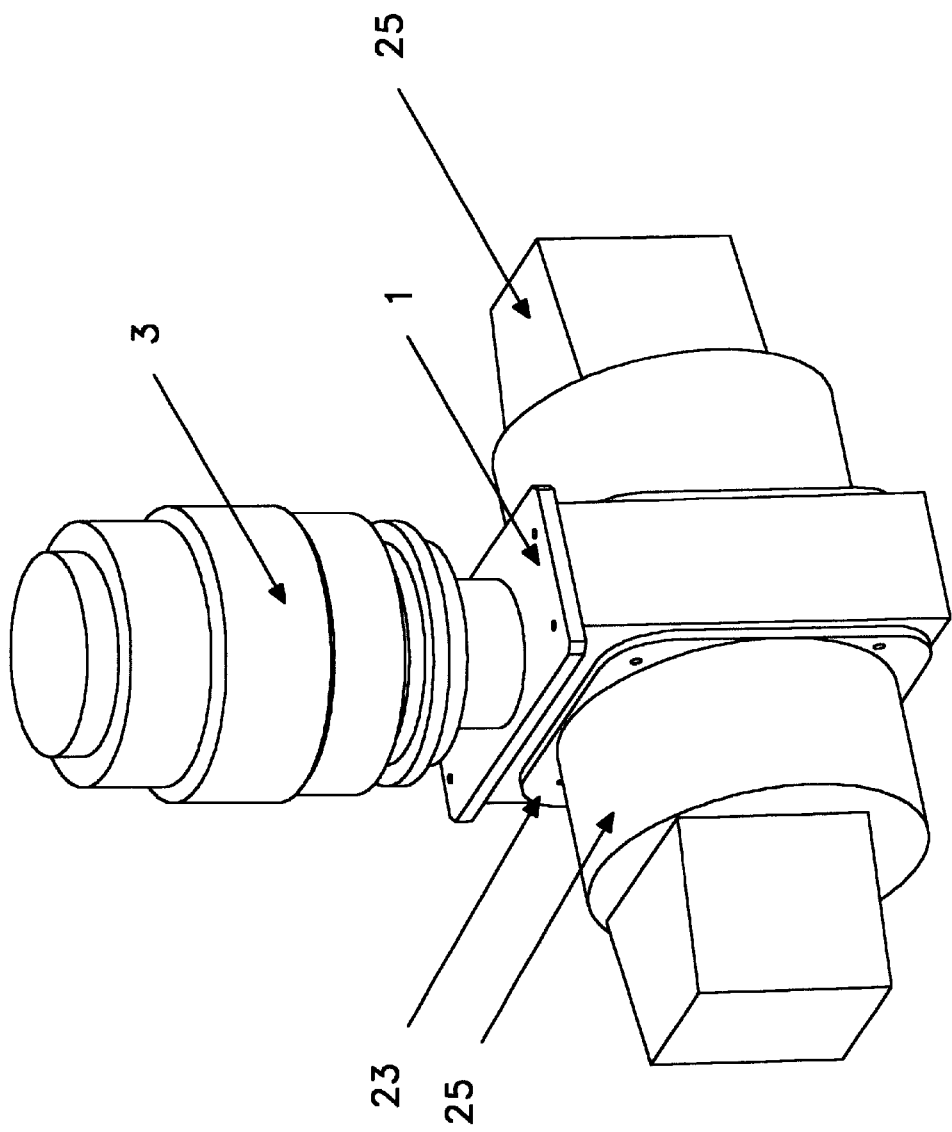
FIG. 7 is an isometric drawing of the exterior of one apparatus showing the processing chamber with two ion sources mounted.

As mentioned earlier, another embodiment is one which is designed to achieve more a uniform deposition across the substrate without a need to move the substrate. FIG. 7 shows a process vacuum chamber (1) with two AE MCIS-12 ion sources (25) for installation on an Intevac 250 machine. This apparatus can replace an existing process chamber accommodating two magnetrons that deposit amorphous carbon rather than DLC. The ion sources can be installed on spacers (23) in order to optimize the distance to substrate. The chamber may be somewhat wider than a standard chamber to allow for the higher pumping speed which may be needed for a faster reactive cleaning cycle. The reason for higher pumping requirements during the reactive cleaning cycle may be that cleaning may require a higher gas flow than the deposition cycle in order to accomplish its objective in a shorter time than the cumulative deposition time to keep throughput of the machine high. The machine may also be programmed (26) to run a reactive cleaning cycle once after every several disks, with a dummy disk, or with no disk at all in the chamber at the time of cleaning. It is currently preferred that the reactive cleaning cycle have the same duration as a deposition cycle of one disk, so the machine works at a constant speed.

Figure 1:
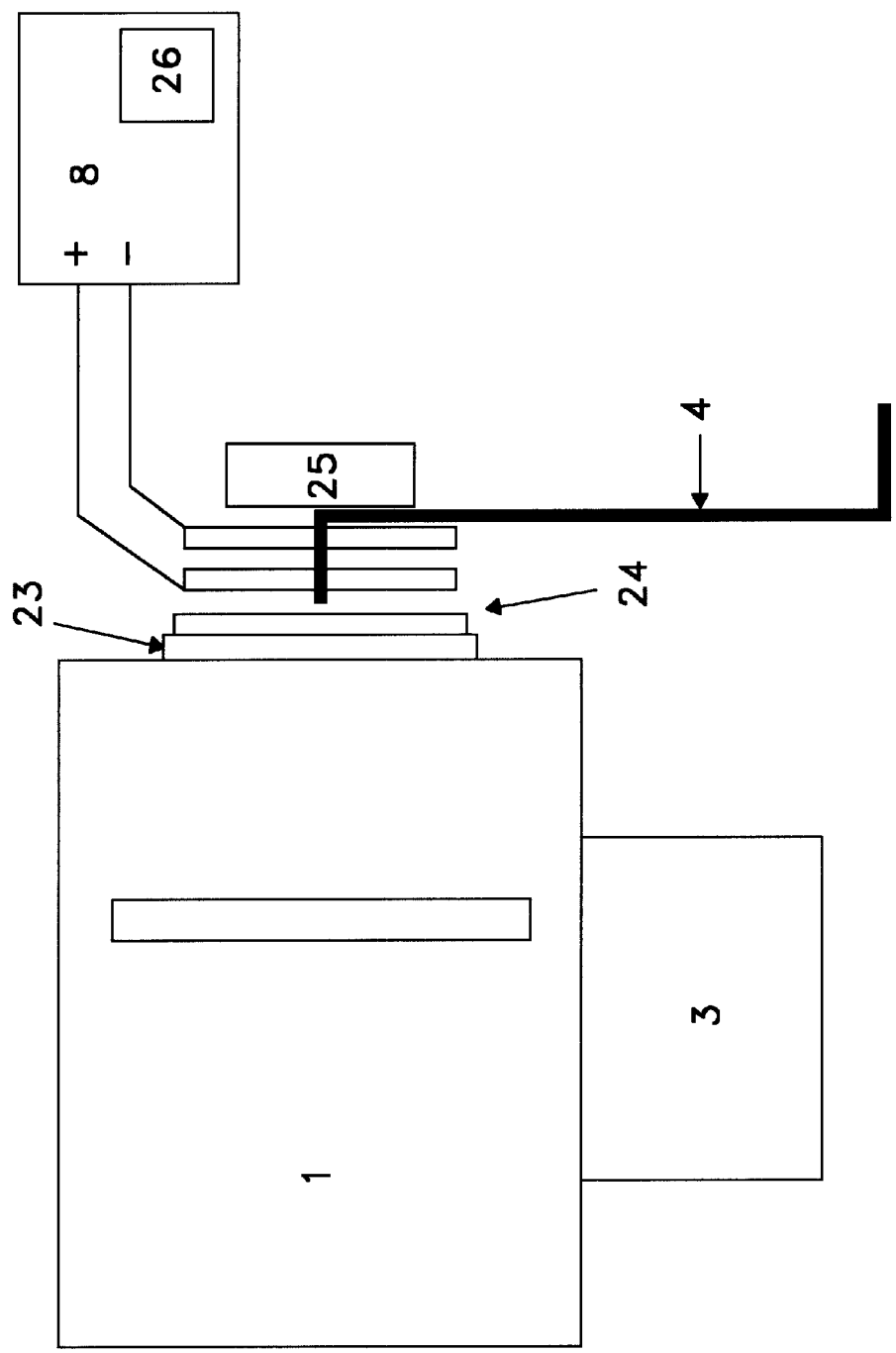
FIG. 1 is a general schematic diagram of an apparatus for one type of uniform deposition indicating the general relationship between the component parts of the apparatus.
Figure 2:
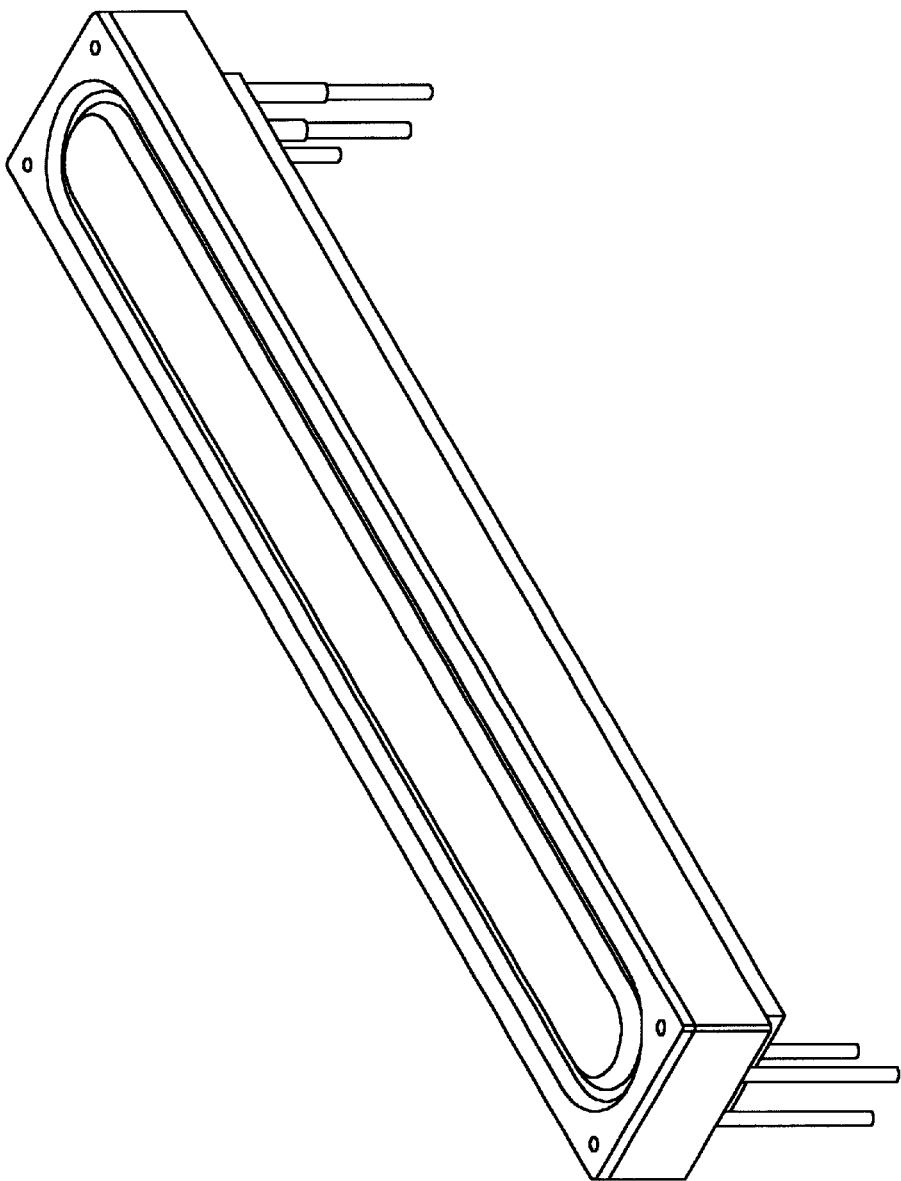
FIG. 2 is a general view of an AE LIS linear ion source.
Figure 3:
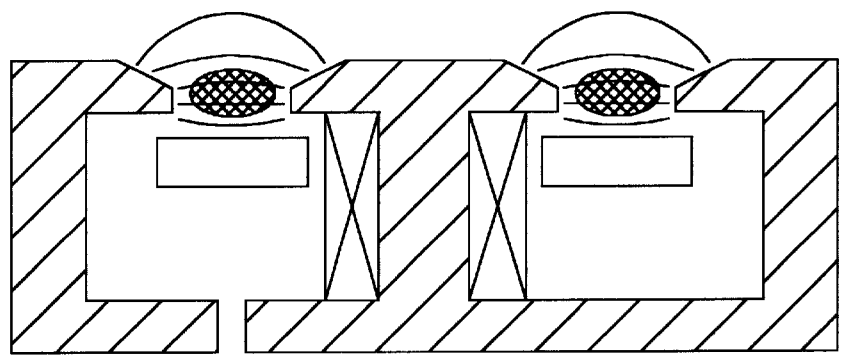
FIG. 3 is a schematic diagram of a LIS linear ion source.
Figure 4:
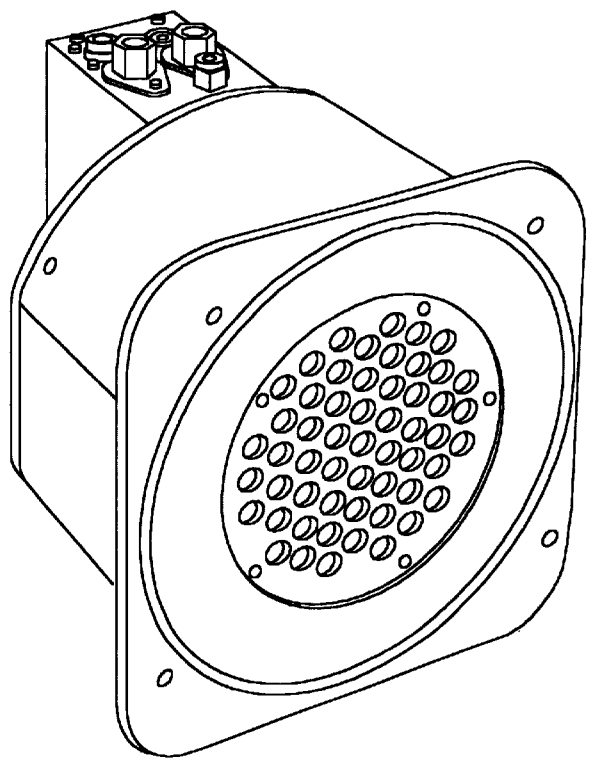
FIG. 4 is a drawing of an AE MCIS-12 Multicell ion source.
Figure 5:
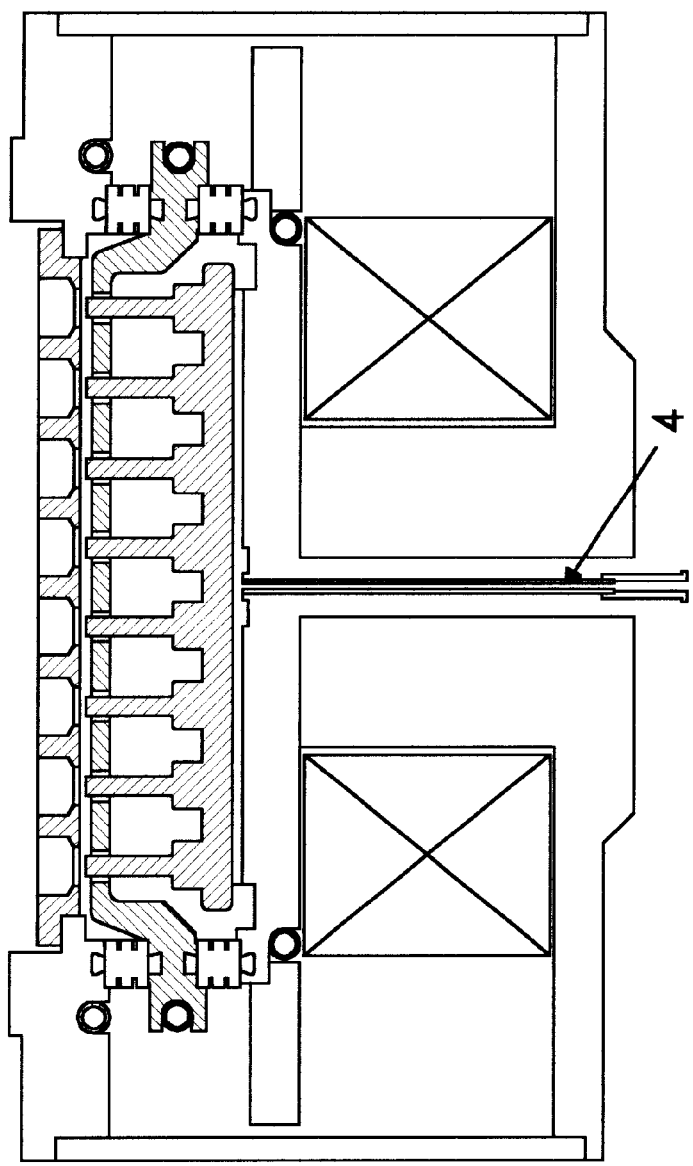
FIG. 5 is a cross sectional view of an MCIS Multicell ion source.

FIG. 1 depicts one way of implementing the radial gas flow barriers (24) in an MCIS-12 ion source (25) manufactured by Advanced Energy Industries, Inc.. This embodiment can accommodate the MCIS design. It is configured so that the gas flow between the back cathode and the anode is from outer edge toward the center. One or more cylindrical parts can be easily installed in this region, as shown on FIG. 1. These may create a gas pressure drop from the edge of the substrate. The heights of the barrier(s) can, of course, be adjusted to compensate for the deposition rate roll off at the edge and make the film thickness uniform from center to edge of the substrate. The currently preferred material would be stainless steel foil that can be spot welded to the back cathode.

As can be understood, this embodiment of the present invention can address at least two distinct modes of non-uniformity. First, the ion beam from a multi-cell ion source, such as the MCIS series manufactured by Advanced Energy Industries, Inc., (AE) may often consist of many smaller beamlets that may overlap at the substrate plane. This cell structure pattern can be evident in the resulting deposited films. The pattern usually weakens as the distance between the ion source and the substrate increases as beamlets from individual cells overlap more. Thus proper configuration can solve this type of nonuniformity.

A second source of non-uniformity can be due to limited ion beam size. This may cause outer regions of the substrate to receive less ions than the inner ones, so the deposition rate can tend to roll off towards the edge. Here, the affected area can grow larger as the distance between the ion source and the substrate increases. Therefore, there can be a trade-off between cell pattern at short distance and the roll-off at longer distance. The radial non-uniformity can be augmented by the fact that even when each cell of the ion source receives the same gas flow, the gas pressure can tend to be higher at the center of the source. This pressure nonuniformity can be bigger at higher pumping speeds because the substrate presents an obstacle to the gas flow. The non-uniform gas pressure can increase the deposition rate roll-off from the substrate center outwards. Accordingly, some embodiments of the present invention provide systems for source-substrate distance optimization and the use of field-installable circular barriers inside the ion source that can redistribute or constrict gas pressure radially so that outer cells may receive more gas this partially mitigating the above mentioned roll-off effect.

As mentioned earlier, this invention can be embodied in a number of ways. In addition, each of the various elements of the invention and claims may also be achieved in a variety of manners. This disclosure should be understood to encompass each such variation, be it a variation of am embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention in entitled. As but one example, it should be understood that all action may be expressed as means for taking that action or as an element which causes that action. Similarly, each physical element disclosed should be understood to encompass a disclosure of the action which that physical element facilitates. Regarding this last aspect, the disclosure of a "supply" should be understood to encompass disclosure of the act of "supplying"—whether explicitly discussed or not—and, conversely, were there are only disclosure of the act of "supplying", such disclosure should be understood to encompass disclosure of a "supply." Such changes and alternative terms are to be explicitly included in the description.

The foregoing discussion and the claims which follow describe the preferred embodiments of the invention. Particularly with respect to the claims it should be understood that changes may be made with departing from their essence. In this regard it is intended that such changes would still fall within the scope of the present invention. It is simply not practical to describe and claim all possible revisions which may be accomplished to the present invention. To the extent such revisions utilize the essence of the invention each would naturally fall within the breadth of protection accomplished by this patent. This particularly true for the present invention since its basic concepts and understandings are fundamental in nature and can be applied in a variety of ways to a variety of fields.

Furthermore, any references mentioned in the application for this patent as well as all references listed in any list of references filed with the application are hereby incorporated by reference in their entirety to the extent such may be deemed essential to support the enablement or claiming of the invention(s). However, to the extent statements might be considered inconsistent with the patenting of this/these invention(s) such statements are expressly not to be considered as made by the applicant(s).

It should be understood that in the application the claims may be expanded to address other aspects as well as those covered, or to address the various combinations and permutations of all the elements or applications are presented. Further, unless the context requires otherwise, the word "comprise" or variations such as "comprising" or "comprises", should be understood to imply the inclusion of a stated element or step or group of elements or steps but not the exclusion of any other element or step or group of elements or steps.

What is claimed is:

1. A method of deposition of Diamond-Like-Carbon on a substrate comprising the steps of:
   a. providing a chamber;
   b. positioning said substrate within said chamber;
   c. creating a low pressure environment within said chamber;
   d. applying power to an ion beam source;
   e. supplying a hydrocarbon-containing gas within said low pressure environment in said chamber;
   f. creating a hydrocarbon-containing gas environment in said low pressure environment within said chamber;
   g. generating an ion beam from said ion beam source as a result of said power applied to said ion beam source in said hydrocarbon-containing gas environment;
   h. forming a diamond-like-carbon coating on said substrate as a result of an interaction between said ion beam and said hydrocarbon-containing gas environment to create a diamond-like-carbon coated substrate, wherein said interaction between said ion beam and said hydrocarbon-containing gas environment also causes the formation of carbon-based material within said chamber;
   i. stopping said step of forming a diamond-like-carbon coating on said substrate;
   j. isolating said diamond-like-carbon coated substrate from a carbon-reactive gas environment;
   k. supplying a carbon-reacting gas within said low pressure environment in said chamber;
   l. creating said carbon-reactive gas environment in said low pressure environment within said chamber;
   m. causing a reaction of least some of said carbon-based material to form at least some carbon reaction product; and
   n. removing at least some of said carbon reaction product from said chamber.

2. A method of deposition of Diamond-Like-Carbon on a substrate as described in claim 1 wherein said step of applying power to an ion beam source comprises the step of applying a first power condition to said ion beam source, wherein said step of causing a reaction of at least some of said carbon-based material to form at least some carbon reaction product comprises the steps of:
   a. applying a second power condition to said ion beam source; and
   b. generating an ion flux from said ion beam source as a result of said second power condition applied to said ion beam source in said carbon-reactive gas environment.

3. A method of deposition of Diamond-Like-Carbon on a substrate as described in claim 2 wherein said step of generating an ion beam from said ion beam source as a result of said power applied to said ion beam source in said hydrocarbon-containing gas environment comprises the step of generating a deposition-appropriate ion beam from said ion beam source as a result of said power applied to said ion beam source in said hydrocarbon-containing gas environment, and wherein said step of generating an ion flux from said ion beam source as a result of said second power condition applied to said ion beam source in said carbon-reactive gas environment comprises the step of generating a carbon-reactive ion flux from said ion beam source as a result of said second power condition applied to said ion beam source in said carbon-reactive gas environment.

4. A method of deposition of Diamond-Like-Carbon on a substrate as described in claim 3 wherein said step of generating a deposition-appropriate ion beam from said ion beam source as a result of said power applied to said ion beam source in said hydrocarbon-containing gas environment comprises the step of generating an ion beam which has a current proportional to voltage as a result of said power applied to said ion beam source in said hydrocarbon-containing gas environment, and wherein said step of generating a carbon-reactive ion flux from said ion beam source as a result of said second power condition applied to said ion beam source in said carbon-reactive gas environment comprises the step of generating an ion flux which has a low impedance as a result of said second power condition applied to said ion beam source in said carbon-reactive gas environment.

5. A method of deposition of Diamond-Like-Carbon on a substrate as described in claim 3 and further comprising the steps of:
 a. avoiding substantially all arcing in the chamber while accomplishing said step of generating a deposition-appropriate ion beam from said ion beam source as a result of said power applied to said ion beam source in said hydrocarbon-containing gas environment; and
 b. permitting arcing to occur within said chamber while accomplishing said step of generating a carbon-reactive ion flux from said ion beam source as a result of said second power condition applied to said ion beam source in said carbon-reactive gas environment.

6. A method of deposition of Diamond-Like-Carbon on a substrate as described in claim 1 wherein said step of supplying a hydrocarbon-containing gas within said low pressure environment in said chamber comprises the step of supplying a gas selected from a group consisting of: acetylene, ethylene, propane, butane, pentane, hexane, or combination thereof, and wherein said step of supplying a carbon-reacting gas within said low pressure environment in said chamber comprises the step of supplying a gas selected from a group consisting of:
 oxygen,
 oxygen and argon, and
 a mix of a noble gas and a reactive gas.

7. A method of deposition of Diamond-Like-Carbon on a substrate as described in claim 2 wherein said step of applying a second power condition to said ion beam source comprises the step of applying substantially the maximum power capable of being applied to said ion beam source during said step of applying a second power condition to said ion beam source.

8. A method of deposition of Diamond-Like-Carbon on a substrate as described in claim 1 wherein said step of causing a reaction of at least some of said carbon-based material to form at least some carbon reaction product is accomplished periodically and further comprising the step of setting a period at which said step of causing a reaction of at least some of said carbon-based material to form at least some carbon reaction product is periodically accomplished.

9. A method of deposition of Diamond-Like-Carbon on a substrate as described in claim 8 wherein said formation of carbon-based material within said chamber occurs at a varying rate and wherein said step of setting a period at which said step of causing a reaction of at least some of said carbon-based material to form at least some carbon reaction product is periodically accomplished comprises the step of setting said period so as to occur before said varying rate substantially increases.

10. A method of deposition of Diamond-Like-Carbon on a substrate as described in claim 8 wherein said step of setting a period at which said step of causing a reaction of at least some of said carbon-based material to form at least some carbon reaction product is periodically accomplished comprises the step of setting said period so as to provide optimal processing throughput.

11. A method of deposition of Diamond-Like-Carbon on a substrate as described in claim 8 wherein said step of setting a period at which said step of causing a reaction of at least some of said carbon-based material to form at least some carbon reaction product is periodically accomplished comprises the step of setting said period so as to provide processing selected from a group consisting of:
 processing to achieve less than about 100 Å of Diamond-Like-Carbon,
 processing to achieve less than about 500 Å of Diamond-Like-Carbon,
 processing to achieve less than about 1,000 Å of Diamond-Like-Carbon,
 processing to achieve less than about 5,000 Å of Diamnond-Like-Carbon,
 processing to achieve less than about 10,000 Å of Diamond-Like-Carbon,
 processing to achieve coating of less than about 10 computer disks,
 processing to achieve coating of less than about 20 computer disks,
 processing to achieve coating of less than about 40 computer disks, and
 processing to achieve coating of less than about 100 computer disks.

12. A method of deposition of Diamond-Like-Carbon on a substrate as described in claim 1 wherein said step of causing a reaction of at least some of said carbon-based material to form at least some carbon reaction product is accomplished for a duration selected from a group consisting of:
 about 1 second,
 about 2 seconds,
 about 4 seconds,
 about a processing time of said substrate, and
 about a processing time of said substrate less a purge time of said carbon-reactive gas environment.

13. A method of deposition of Diamond-Like-Carbon on a substrate as described in claim 1 wherein said step of causing a reaction of at least some of said carbon-based material to form at least some carbon reaction product is accomplished for a duration of about a processing time of said substrate less a purge time of said carbon-reactive gas environment and further comprising the step of discarding a substrate processed after initiating said step of causing a reaction of at least some of said carbon-based material to form at least some carbon reaction product.

14. A method of deposition of Diamond-Like-Carbon on a substrate as described in claim 1 and further comprising the step of directing said ion beam at said substrate.

15. A method of deposition of Diamond-Like-Carbon on a substrate as described in claim 14 wherein said step of causing a reaction of at least some of said carbon-based material to form at least some carbon reaction product comprises the step of creating at least some gaseous reaction product.

16. A method of deposition of Diamond-Like-Carbon on a substrate as described in claim 15 wherein said step of isolating said diamond-like-carbon coated substrate from a carbon-reactive gas environment comprises the step of removing said diamond-like-carbon coated substrate from said chamber.

17. A method of deposition of Diamond-Like-Carbon on a substrate as described in claim 1 wherein said step of applying power to an ion beam source comprises the step of applying power to an ion beam source selected from a group consisting of:
- a linear ion source,
- a cold cathode ion source,
- a non-hot electron emitter ion source,
- a closed drift ion source,
- a multi-cell cold cathode anode-layer closed drift ion source,
- a linear cold cathode anode-layer closed drift ion source,
- a single cell ion source,
- an anode-layer ion source, and
- an end-hall ion source.

18. A method of deposition of Diamond-Like-Carbon on a substrate as described in claim 1 wherein said step of supplying a hydrocarbon-containing gas within said low pressure environment in said chamber occurs at a rate, and wherein said step of supplying a carbon-reacting gas within said low pressure environment in said chamber occurs at a rate substantially greater than the rate at which said step of supplying a hydrocarbon-containing gas occurs.

19. A method of deposition of Diamond-Like-Carbon on a substrate as described in claim 2 wherein said step of applying a first power condition to said ion beam source comprises the step of applying a first power condition to said ion beam source selected from a group consisting of:
- a voltage of from about 100 volts to about 1000 volts with a single cell source,
- a current of from about 0.1 amperes to about 20 amperes with a single cell source,
- a voltage of from about 100 volts to about 1000 volts and a current of from about 0.1 amperes to about 20 amperes with a single cell source,
- a voltage of from about 100 volts to about 2000 volts,
- a voltage of from about 1000 volts to about 2000 volts,
- a current of from about 0.5 amperes per linear meter of ion source length to about 15 amperes per linear meter of ion source length, and wherein said step of applying a second power condition to said ion beam source comprises the step of applying a second power condition to said ion beam source selected from a group consisting of:
- a voltage of from about 100 volts to about 600 volts,
- a power level that is at least about twice the level of power applied to said ion beam source during said step of applying a first power condition to said ion beam source,
- a power level that is at least about three times the level of power applied to said ion beam source during said step of applying a first power condition to said ion beam source,
- a power level that is at least about four times the level of power applied to said ion beam source during said step of applying a first power condition to said ion beam source,
- a power level that is at least several times the level of power applied to said ion beam source during said step of applying a first power condition to said ion beam source,
- a power application which lasts for a time short compared to the time during which said first power condition is applied to said ion beam source,
- a power level which ramps up during said step of applying a second power condition to said ion beam source,
- a power level which ramps up during said step of applying a second power condition to said ion beam source over a time period of from about 0.1 seconds to about 4 seconds, and
- a power level which permits arcs to occur such arc supplying less than about 20 millijoules of energy during their occurrence.

20. A method of deposition of Diamond-Like-Carbon on a substrate as described in claim 19 wherein said step of supplying a hydrocarbon-containing gas within said low pressure environment in said chamber comprises the step of supplying a gas selected from a group consisting of: acetylene, ethylene, propane, butane, pentane, hexane, or combination thereof, and wherein said step of supplying a carbon-reacting gas within said low pressure environment in said chamber comprises the step of supplying a gas selected from a group consisting of:
- oxygen,
- oxygen and argon, and
- a mix of a noble gas and a reactive gas.

21. A method of deposition of Diamond-Like-Carbon on a substrate as described in claim 20 wherein said step of supplying a carbon-reacting gas within said low pressure environment in said chamber comprises the step of supplying an oxygen containing gas within said low pressure environment in said chamber, and wherein said step of causing a reaction of at least some of said carbon-based material to form at least some carbon reaction product comprises the step of forming a reaction product selected from a group consisting of:
- carbon monoxide, and
- carbon dioxide, and
- any other combination of carbon and oxygen.

22. A method of repetitively processing substrates to create a Diamond-Like-Carbon coating comprising the steps of:
a. feeding substrates for processing in a chamber;
b. processing said substrates within said chamber comprising the steps of:
  i. supplying a hydrocarbon-containing gas within said processing environment in said chamber; and
  ii. forming a diamond-like-carbon coating on at least some of said substrates whereby carbon-based material is formed within said chamber;
c. automatically interrupting processing of said substrates within said chamber;
d. automatically eliminating at least some of said carbon-based material within said chamber; and
e. automatically recommencing said step of processing substrates within said chamber.

23. A method of repetitively, processing substrates to create a Diamond-Like-Carbon coating as described in claim 22 wherein said step of processing said substrates within said chamber comprises the step of accomplishing deposition as described in claim 1.

24. A method of repetitively processing substrates to create a Diamond-Like-Carbon coating as described in claim 22 wherein said step of feeding substrates for processing in a chamber comprises the step of continuously feeding a plurality of substrates for processing within said chamber.

25. A method of repetitively processing substrates to create a Diamond-Like-Carbon coating as described in claim 22 wherein said step of processing said substrates within said chamber further comprises the steps of:
 a. applying power to an ion beam source; and
 b. generating an ion beam from said ion beam source as a result of said power applied to said ion beam source in said processing environment.

26. A method of repetitively processing substrates to create a Diamond-Like-Carbon coating as described in claim 25 wherein said step of automatically interrupting processing of said substrates within said chamber comprises the steps of:
 a. stopping said step of applying power to an ion beam source; and
 b. stopping said step of supplying a hydrocarbon-containing gas within said processing environment in said chamber.

27. A method of repetitively processing substrates to create a Diamond-Like-Carbon coating as described in claim 25 wherein said carbon-based material is made of a carbon-based substance and further comprising the step of removing at least some of said carbon-based substance from said chamber.

28. A method of repetitively processing substrates to create a Diamond-Like-Carbon coating as described in claim 25 wherein said step of processing said substrates within said chamber comprising the step of applying a first power condition to an ion beam source and wherein said step of automatically eliminating at least some of said carbon-based material within said chamber comprises the step of applying a second power condition to said ion beam source.

29. A method of repetitively processing substrates to create a Diamond-Like-Carbon coating as described in claim 22 wherein said step of forming a diamond-like-carbon coating on at least some of said substrates establishes a processed substrate and further comprising the step of removing said processed substrate from said chamber prior to accomplishing said step of automatically eliminating at least some of said carbon-based material within said chamber.

30. A method of repetitively processing substrates to create a Diamond-Like-Carbon coating as described in claim 29 wherein said step of feeding substrates for processing in a chamber comprises the steps of:
 a. feeding desired substrates for processing in said chamber prior to accomplishing said step of forming a diamond-like-carbon coating on at least some of said substrates; and
 b. avoiding feeding desired substrates in said chamber prior to accomplishing said step of automatically eliminating at least some of said carbon-based material within said chamber.

31. A method of repetitively processing substrates to create a Diamond-Like-Carbon coating as described in claim 22 wherein said step of automatically eliminating at least some of said carbon-based material within said chamber comprises the steps of:
 a. supplying a carbon-reacting gas to said chamber;
 b. causing a reaction of at least some of said carbon-based material to form at least some carbon reaction product; and
 c. removing at least some of said carbon reaction product from said chamber.

32. A method of repetitively processing substrates to create a Diamond-Like-Carbon coating as described in claim 22 wherein said step of automatically eliminating at least some of said carbon-based material within said chamber comprises the step of permitting at least some arcing to occur within said chamber.

33. A method of repetitively processing substrates to create a Diamond-Like-Carbon coating as described in claim 32 wherein said step of automatically eliminating at least some of said carbon-based material within said chamber comprises the step of applying substantially the maximum power capable of being applied to an ion beam source at least some time.

34. A method of repetitively processing substrates to create a Diamond-Like-Carbon coating as described in claim 22 and further comprising the step of determining a time at which said step of automatically interrupting processing of said substrates within said chamber should occur.

35. A method of repetitively processing substrates to create a Diamond-Like-Carbon coating as described in claim 34 wherein said step of determining a time at which said step of automatically interrupting processing of said substrates within said chamber comprises the step of setting a period at which said step of automatically interrupting processing of said substrates within said chamber is accomplished so as to provide optimal processing throughput.

36. A method of repetitively processing substrates to create a Diamond-Like-Carbon coating as described in claim 34 wherein said step of determining a time at which said step of automatically interrupting processing of said substrates within said chamber comprises the step of setting a period at which said step of automatically interrupting processing of said substrates within said chamber is accomplished so as to provide processing selected from a group consisting of:
 processing to achieve less than about 100 Å of Diamond-Like-Carbon,
 processing to achieve less than about 500 Å of Diamond-Like-Carbon,
 processing to achieve less than about 1,000 Å of Diamond-Like-Carbon,
 processing to achieve less than about 5,000 Å of Diamond-Like-Carbon,
 processing to achieve less than about 10,000 Å of Diamond-Like-Carbon,
 processing to achieve coating of less than about 10 computer disks,
 processing to achieve coating of less than about 20 computer disks,
 processing to achieve coating of less than about 40 computer disks, and
 processing to achieve coating of less than about 100 computer disks.

37. A method of repetitively processing substrates to create a Diamond-Like-Carbon coating as described in claim 34 wherein said step of automatically eliminating at least some of said carbon-based material within said chamber is accomplished for a duration selected from a group consisting of:
 about 1 second,
 about 2 seconds,
 about 4 seconds,
 about a processing time of said substrate, and
 about a processing time of said substrate less a purge time of a gas environment.

38. A method of repetitively processing substrates to create a Diamond-Like-Carbon coating as described in claim 34 wherein said step of automatically eliminating at least some of said carbon-based material within said chamber is accomplished for a duration of about a processing time of a substrate less a purge time of a gas environment and further comprising the step of discarding a substrate processed after initiating said step of automatically eliminating at least some of said carbon-based material within said chamber.

39. A method of repetitively processing substrates to create a Diamond-Like-Carbon coating comprising the steps of:
 a. repetitively feeding substrates for processing in a chamber;
 b. supplying a hydrocarbon-containing gas within said processing environment in said chamber;
 c. repetitively forming a particle-free diamond-like-carbon coating on said substrates;
 d. affirmatively avoiding the formation of any carbon-based particles on said substrates within said chamber; and
 e. repetitively removing said substrates from said chamber.

40. A method of repetitively processing substrates to create a Diamond-Like-Carbon coating as described in claim 39 wherein said step of repetitively forming a particle-free diamond-like-carbon coating on said substrates comprises the step of applying power to an ion beam source and wherein said step of automatically acting to affirmatively avoid the formation of any carbon-based particles within said chamber comprises the step of automatically altering said step of applying power to an ion beam source.

41. A method of repetitively processing substrates to create a Diamond-Like-Carbon coating as described in claim 40 wherein said step of automatically acting to affirmatively avoid the formation of any carbon-based particles within said chamber further comprises the step of automatically altering said step of supplying a hydrocarbon-containing gas within said processing environment in said chamber.

42. A method of repetitive processing substrates to create a Diamond-Like-Carbon coating as described in claim 39 wherein said step of affirmatively avoiding the formation of any carbon-based particles within said chamber comprises the step of automatically acting to affirmatively avoid the formation of any carbon-based particles within said chamber.

43. A method of repetitively processing substrates to create a Diamond-Like-Carbon coating as described in claim 39 wherein said step of repetitively forming a particle-free diamond-like-carbon coating on said substrates comprises the step of processing selected from a group consisting of:
 processing to achieve a cumulative amount of greater than about 500 Å of Diamond-Like-Carbon,
 processing to achieve a cumulative amount of greater than about 1000 Å of Diamond-Like-Carbon,
 processing to achieve a cumulative amount of greater than about 3,000 Å of Diamond-Like-Carbon,
 processing to achieve a cumulative amount of greater than about 10,000 Å of Diamond-Like-Carbon,
 processing to achieve coating of greater than about 20 computer disks,
 processing to achieve coating of greater than about 40 computer disks, and
 processing to achieve coating of greater than about 100 computer disks.

44. A method of repetitively processing substrates to create a Diamond-Like-Carbon coating as described in claim 39 wherein said step of automatically acting to affirmatively avoid the formation of any carbon-based particles within said chamber comprises the step of automatically altering said step of supplying a hydrocarbon-containing gas within said processing environment in said chamber.

* * * * *